(12) United States Patent
Karg

(10) Patent No.: US 8,530,739 B2
(45) Date of Patent: Sep. 10, 2013

(54) NANOWIRE MULTIJUNCTION SOLAR CELL

(75) Inventor: Siegfried F. Karg, Adliswil (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/536,348

(22) Filed: Jun. 28, 2012

(65) Prior Publication Data

US 2012/0276678 A1    Nov. 1, 2012

Related U.S. Application Data

(62) Division of application No. 12/404,406, filed on Mar. 16, 2009, now Pat. No. 8,242,353.

(51) Int. Cl.
*H01L 31/00* (2006.01)
*H01L 31/18* (2006.01)

(52) U.S. Cl.
USPC ............. 136/256; 136/259; 136/252; 438/69; 438/72

(58) Field of Classification Search
USPC ................ 136/256, 259, 252; 438/69, 72
See application file for complete search history.

(56) References Cited

U.S. PATENT DOCUMENTS

| | | |
|---|---|---|
| 4,488,047 A | 12/1984 | Thomas |
| 5,720,827 A | 2/1998 | Simmons |
| 6,996,147 B2 | 2/2006 | Majumdar et al. |
| 2006/0207647 A1 | 9/2006 | Tsakalakos et al. |
| 2007/0137697 A1 | 6/2007 | Kempa et al. |
| 2008/0156366 A1 | 7/2008 | Kim et al. |
| 2008/0223438 A1 | 9/2008 | Xiang et al. |
| 2009/0056791 A1 | 3/2009 | Pfenninger et al. |
| 2009/0057839 A1 | 3/2009 | Lewis et al. |
| 2009/0165844 A1 | 7/2009 | Dutta |

OTHER PUBLICATIONS

Brendan M. KAYeS et al., "Synthesis and Characterization of Silicon Nanorod Arrays for Solar Cell Applications", pp. 4, California Institute of Technology, Pasadena, CA 91125; University of Cambridge, Cambridge, England, 2006.
Bing Tan et al., "Dye Sensitized Solar Cells Based on Anatase TiO2 Nanoparticle/Nanowire Composites"; J. Phys. Chem. B 2006, 110, No. 32, pp. 15932-15938.
Charles M. Lieber et al., "Functional Nanowires", MRS Bulletin, vol. 32, Feb. 2007, pp. 99-108.
Eray S. Aydil et al., "Photovoltaic Devices Based on Nanoparticles and Nonowires"; NSF Nanoscale Science and Engineering Grantees Conference, Dec. 4-6, 2006 Grant # 0506672; pp. 1-3.
King, Richard R., et al.; "Advances in High-Efficiency III-V Multijunction Solar Cells"; Advances in OptoElectronics; vol. 2007; p. 1-8; 2007.
Philip Wong et al., "Lateral Nanoconcentrator Nanowire Multijunction Photovoltaic CELLS", GCEP Global Climate and Energy Project Stanford University, Sep. 2007-Aug. 2010; pp. 1-13.

(Continued)

*Primary Examiner* — Jennifer Michener
*Assistant Examiner* — Golam Mowla
(74) *Attorney, Agent, or Firm* — Cantor Colburn LLP; Daniel Morris

(57) ABSTRACT

A solar cell includes a substrate layer and a plurality of nanowires grown outwardly from the substrate layer, at least two of the nanowires including a plurality of sub-cells. The solar cell also includes one or more light guiding layers formed of a transparent, light scattering material and filling the area between the plurality of nanowires.

6 Claims, 3 Drawing Sheets

(56) References Cited

OTHER PUBLICATIONS

Roman, Jose M.; "State-of-the-art of III-V Solar Cell Fabrication Technologies, Device Designs and Applications"; Advanced Photovoltaic Design; p. 1-8; 2004.

Stephen J. Pearton et al., "The Promise and Perils of Wide-Bandgap Semiconductor Nanowires for Sensing, Electronic, and Photonic Applications"; Small 2007, 3, No. 7, pp. 1144-1150; 2007 Wiley-Vch Veriag GmbH & Co., KgaA, Weinheim.

Tyler Hamilton, "Flexible, Nanowire Solar Cells Exotic Materials and Cheaper substances could lead to better photovoltaics"; Technology Review published by MIT, Wednesday, Feb. 6, 2008 pp. 1-3.

NANOWIRE MULTIJUNCTION SOLAR CELL

CROSS-REFERENCE TO RELATED APPLICATIONS AND PRIORITY CLAIM

This application is a Divisional Application of U.S. Non-Provisional application Ser. No. 12/404,406, entitled "NANOWIRE MULTIJUNCTION SOLAR CELL", filed Mar. 16, 2009, under 35 U.S.C. §120, which is incorporated herein by reference in its entirety.

BACKGROUND OF THE INVENTION

The present invention relates to solar energy and, specifically, to creating energy from solar radiation utilizing nanowire structures.

A solar cell or photovoltaic cell is a device that converts solar energy into electricity by the photovoltaic effect. Photovoltaic electricity generation is one of the most promising sources of alternative energy. Accordingly, research and development in this area is important and may yield viable alternatives to current energy sources.

Currently, one type of photovoltaic device showing good efficiency are multijunction solar cells based on type III-V semiconductor technology. These cells achieve their high efficiency by combining several solar cells, or p-n junctions, into a multijunction cell and include multiple subcells. Each of these subcells is composed of a different semiconductor material having a bandgap of different width. Typically, each cell has a three-junction cell configuration with three-subcells electrically connected in series. The subcells are also positioned in optical series such that the subcell with the largest bandgap is on top (facing the sun) and the other subcells are positioned in order of descending width of the bandgap. Hence, in the top subcell only the photons with the highest energy are absorbed. Photons with a lower energy are transmitted to the subcell beneath, and so on. In this way the multijunction solar cell divides the broad solar spectrum into wavelength bands, each of which can be used more efficiently by the individual subcells than in a single-junction case. In particular, photons with higher energy contribute with a larger photo-voltage than those with lower energy. Multijunction solar cells require a tunnel diode for current transfer from one subcell to the other. State-of-the-art multijunction cells provide an energy conversion efficiency of 40%.

BRIEF SUMMARY

According to one embodiment of the present invention, a solar cell including a substrate layer and a plurality of nanowires grown outwardly from the substrate layer is provided. At least two of the nanowires include one or more sub-cells, each sub-cell being formed of a material having a bandgap voltage in this embodiment. The solar cell of this embodiment also includes one or more light guiding layers formed of a transparent, light scattering material and located on top of the substrate layer and between the plurality of nanowires, each light guiding layer configured to scatter light of particular wavelength.

Another embodiment of the present invention is directed to a method of creating a solar cell. The method of this embodiment includes forming a substrate layer, growing a plurality of nanowires grown outwardly from the substrate layer, at least two of the nanowires including one or more sub-cells, each sub-cell being formed of a material having a bandgap voltage, and forming one or more light guiding layers formed of a transparent, light scattering material in the area between the plurality of nanowires.

Another embodiment of the present invention is directed to a solar cell that includes a substrate layer and a plurality of nanowires grown outwardly from the substrate layer, at least two of the nanowires having a plurality of sub-cells, each sub-cell having bandgap voltage. The solar cell of this embodiment also includes two light guiding layers formed of a transparent, light scattering material and filling the area between the plurality of nanowires. The light guiding layers include a first light guiding layer and a second light guiding layer, the first light guiding layer contacting the substrate layer, the second light guiding layer being disposed further from the substrate layer than the first light guiding layer. The solar cell also includes a first light diffracting layer disposed between the first light guiding layer and the second light guiding layer.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
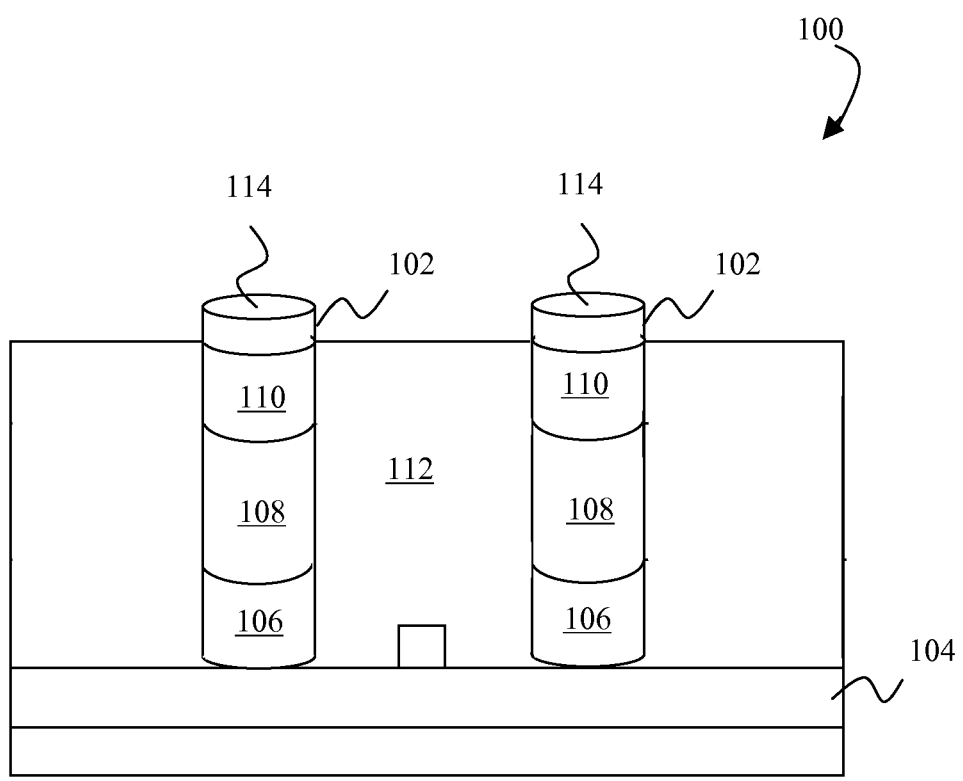
FIG. 1 shows a cut-away side view of a nanowire solar cell.

In conventional multijunction solar cells, in order to achieve high efficiency, perfect crystalline order is required in the p-n junction regime. That is, a minimum number of crystal defects, e.g., dislocations, are allowed. Hence, the subcells are grown in an epitaxial way with additional buffer layers to account for the lattice mismatch. Many electrically favorable materials are, thus, ruled out due to these epitaxial constraints. Accordingly, the substrate materials may be limited to Ge, GaAs or InP to ensure a proper lattice match. However, and in particular in the case of Ge, these materials provide a small bandgap.

These multijunction cells consist of multiple thin films produced by molecular beam epitaxy and/or metalorganic vapour phase epitaxy. Each additional layer provides an electrical resistance that reduces the overall efficiency. In state-of-the-art multijunction cells, GaInP, GaAs, and Ge are used which have bandgaps of 1.8 eV, 1.4 eV, and 0.7 eV, respectively.

Fabrication of multijunction solar cells is very costly. In particular, the limited size and the high price of the usable substrate wafers raise production costs. Typically, optical light concentrators are used to make better use of these solar cells. However, these require expensive mechanical installations for solar tracking. A further drawback of the above-mentioned multijunction solar cells is that the photoactive layers have to be fairly thick in order to provide sufficient adsorption of the desired wavelength band. This prolongs processing time and increases the material consumption.

Another disadvantage of the prior-art devices is the increased cell temperature if a light concentrator is used. Temperatures considerable above room temperature decrease the overall efficiency of the cell (typically 10% per 25K). Furthermore, the larger temperature variations lead to mechanical stress and degradation.

Embodiments of the present invention are directed to multijunction solar cells formed of grown nanowires. The present invention teaches a multijunction solar cell based on grown nanowires. Stacks of grown semiconducting nanowires may be formed of Si or Ge or compound semiconductors such as GaAs or GaInP. These stacks may provide superior crystal quality even if the lattice constants of adjacent layers are not matched. Thus, buffer layers or other lattice matching interlayers are not required as in the prior art while still allowing of the nanowire stacks to provide exceptional electrical and optical quality. The reduction in layers provides reductions in processing and material usage as well as reducing the series resistance of each cell. Nanowire stacks can be grown of material combinations which are not accessible in planar technology. Thus, optimized multijunction cells with, for example, Si base cells, are achievable with less efforts than in planar technology in embodiments of the present invention.

Furthermore, vertical nanowires can be grown on a variety of substrates. In particular, type III-V compound semiconductor nanowires can be grown by metalorganic vapour phase epitaxy on silicon wafers. This offers the advantage of a much larger wafer size than state-of-the-art multijunction cell processes (300 mm vs. 100 mm) and may lead to advantages as the usable area is roughly one order of magnitude larger. Additionally, even larger substrates based on polycrystalline silicon are usable. Grown nanowires cover only a fraction of the substrate area. This has the advantage that the material consumption is respectively lower than in planar technology.

In one embodiment, in order to utilize the light that is falling on the area between the nanowires, light-guiding layers may be introduced in the area between the subcells of the nanowires. Light with the shortest wavelength is preferably guided in layer to the subcell with the largest bandgap. Light with longer wavelength is preferably transmitted to the next layer where the adjacent wavelength band is selected and so on. Light being transmitted to the substrate (e.g. Si) can be converted to electrical power using the substrate as a conventional planar solar cell.

In summary, embodiments of the present invention may be advantageous as compared to the state-of-the-art multi-junction solar cells based on planar technology because they allow for more flexibility in the choice of material combinations with respect to the bandgap selection and, thus, allow for higher efficiencies. In addition, embodiments of the present invention may have lower series resistance due to fewer layers, processing advantages and cost reduction due to use of large-area substrates and the larger growth rate of nanowires compared to planar technology (>10 nm/s vs.<1 nm/s), and less material consumption or lower thermal stress due to distributed cells. In addition, embodiments may include fewer mechanical installations than planar cells because of reduced need of light concentration and, because subcells can be fabricated of thinner semiconducting layers as the absorption occurs in the horizontal plane and multiple reflections can occur, less material may be needed resulting in higher efficiency.

FIG. 1 shows a cut-away side view of a multiple nanowire solar cell 100 according to one embodiment. The solar cell 100 includes multiple nanowires 102. As shown, the solar cell 100 includes two nanowires 102. Of course, this is not by way of limitation and the solar cell 100 could include any number to nanowires 102.

Each nanowire 102 may be vertically grown from seed particles positioned on a bottom contact 104. That is, seed particles may be located on the bottom contact 104 from which any number of nanowires at any position may be grown. The bottom contact 104 may, in one embodiment, be a layer of silicon. This bottom contact may, in one embodiment, itself function as a solar cell.

In one embodiment, the nanowires 102 may be grown using chemical vapor deposition or metal-organic vapor phase epitaxy. In either case, the composition of each nanowire 102 may be controlled during growth. As such, each nanowire 102 may include a plurality of sub-cells. As shown, each nanowire 102 includes three sub-cells 106, 108 and 110. Of course, the number of sub-cells is not limited to three and may be any number of cells equal to or greater than one.

In one embodiment, during the nanowire 102 growth, elemental and compound semiconductors with different bandgaps can be grown in series. Moreover, p- and n-doped segments can be created forming pn-junction and tunnel diodes. As the grown nanowires 102 offer exceptional crystal quality, high carrier mobility and low recombination rates are achieved allowing high photovoltaic quantum efficiency.

In one embodiment, each adjacent sub-cell is formed of a different semiconductor material than its neighbor. In one embodiment, semiconductors with non-matching lattice constants can be grown directly on top of each other as the stress is released towards the outside of the nanowire 102. Accordingly, semiconductors Si and Ge can be used as well as compound-semiconductors of type III-V such as GaAs, InGaAs, GaInP. Furthermore, similar nanowire stacks as of the state-of-the-art devices can be grown in superior quality even if the buffer layers are omitted. Moreover, materials combinations with bandgaps ideally suited for photovoltaic power conversion independent of a matching lattice constant can be grown.

In one embodiment, in order to distribute the wavelength bands equally over the solar spectrum, the three junction nanowires 102 may have subcells with bandgaps of 2.0 eV, 1.4 eV and 0.8 eV. In one embodiment, the closer to the bottom contact 104, the lower the bandgap of the subcell. Thus, for example, sub-cell 106 may a bandgap of 0.8 eV, sub-cell 108 may have a bandgap of 1.4 eV and sub-cell 110 may have a bandgap of 2.0 eV. Of course, the sub-cells could have other bandgaps or orientation of sub-cells.

In contrast to planar technology, Si substrates (e.g. bottom contact 104) can be used for nanowire solar cells according to one embodiment. Hence, a much larger waver size can be used for manufacturing. Moreover, polycrystalline silicon substrates with a high degree of crystallites oriented in the 100 or 111 direction provide a suitable platform with even larger area at a much lower cost.

In one embodiment, the solar cell is grown on a bottom contact 104 composed of a polycrystalline Si solar cell. As the nanowires 102 do not cover the whole bottom contact 104, light penetrating the solar cell 100 between the nanowires 102 may be converted by the polycrystalline Si cell bottom contact 104. In one embodiment, the nanowires 102 may be coated with an insulating shell for protection against corrosion or other chemical reactions.

In a further preferred embodiment, the volume between the nanowires 102 may be filled with a transparent, light scattering material 112. The light scattering material 112 may be, for example, a polymer having dispersed nanoparticles contained therein or a phase-segregated polymer consisting of nano-sized domains with different refractive indices. This light scattering material may encourage a large fraction of the light penetrating the solar cell between the nanowires 102 to be scattered and, consequently, to contact the nanowire stacks 102 and be absorbed by them. As the scattering probability decreases with longer wavelength, short-wavelength light will be scattered predominantly in the upper part of the cell towards the subcell 110 with the largest bandgap, shorter wavelengths in the lower portions towards the lower bandgap energy subcells 108 and 106.

Figure 2:
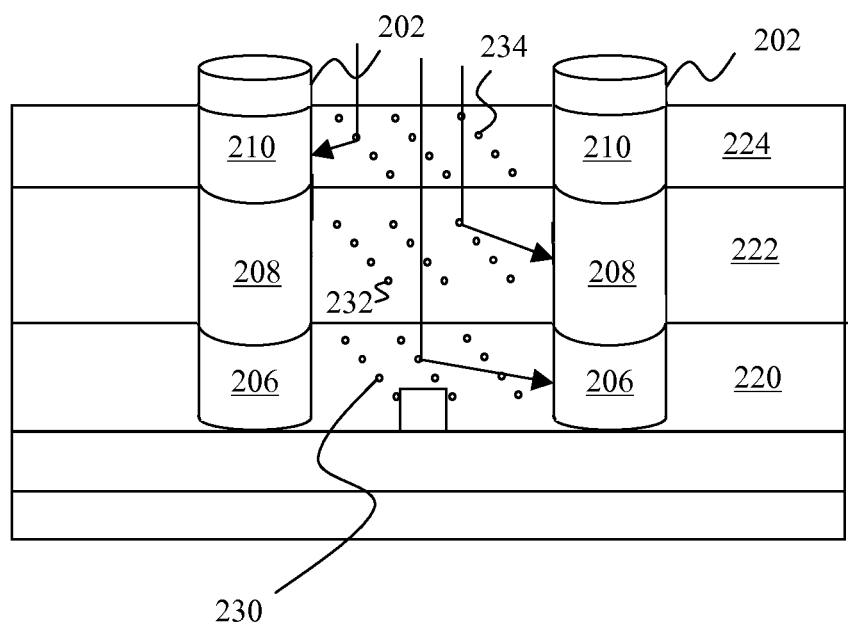
FIG. 2 shows a cut-away side view of a nanowire multijunction solar cell according to another embodiment of the present invention including nanoparticles disposed in the light guiding layers.

FIG. 2 shows a cut-away side view of a multiple nanowire multiple solar cell 200 according to another embodiment. The solar cell 200 includes multiple nanowires 202. As shown, the solar cell 200 includes two nanowires 202. Of course, cell 200 could have any number to cells. Each cell may constructed as described above and may include, for example, a plurality of sub-cells. As shown, each nanowire 202 includes three sub-cells 206, 208 and 210. Of course, the number of sub-cells is not limited to three and may be any number of cells. In this embodiment, the solar cell 200 includes light guiding layers 220, 222 and 224. These light guiding layers may guide different wavelengths of light to the different sub-cells of the nano-wires 202. For example, light guiding layer 224 may guide light with short wavelengths to the sub-cell having the largest bandgap (e.g., sub-cell 110). Light guiding layer 222 may guide light having longer wavelengths than those guided by light guiding layer 224 to sub-cell 208 and even longer wavelengths may be guided by light guiding layer 220 to sub-cell 206. It will be understood that it may be preferable to have the number of light guiding layers equal the number of sub-cell per nanowire.

In one embodiment, each light guiding layer may be constructed from a transparent, light scattering material having different size of the nanoparticles 230, 232 and 234. As light-scattering probability depends on the size of the scattering particle, smaller particles will be used for the short-wavelength region in the top layer 224 and increasing particle sizes in lower lying layers, 222 and 220, respectively.

Figure 3:
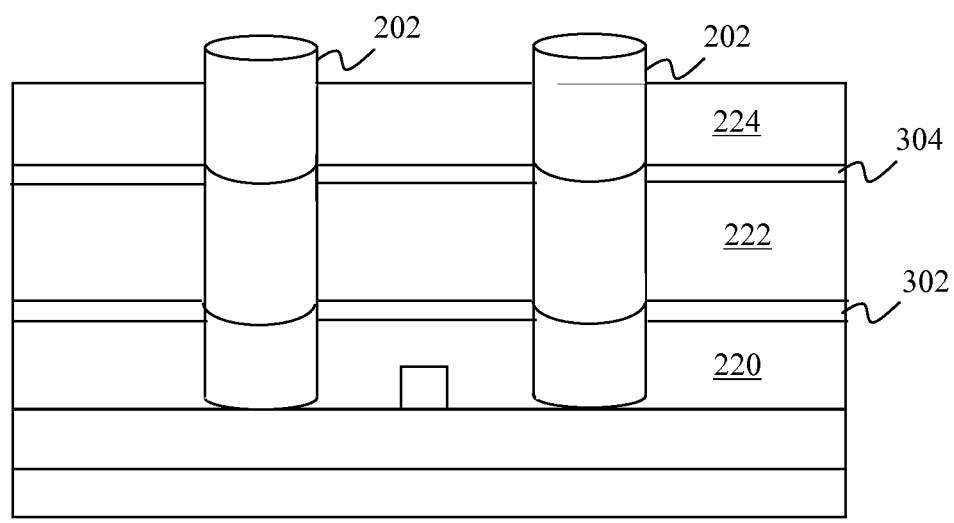
FIG. 3 shows a cut-away side view of a nanowire multijunction solar cell according to one embodiment of the present invention having refractive layers between the light guiding layers.

FIG. 3 shows another embodiment of the present invention. In this embodiment, the light guiding layers 220, 222 and 224 are separated by layers with a lower refractive index in order to increase the light-guiding capability. In particular, the scattering (light guiding) layers 220, 222 and 224 may act as waveguides if they are separated by layers of lower refractive index than the light guiding layer above it. As show, light guiding layer 220 is separated from light guiding layer 222 by the refractive layer 302 and light guiding layer 222 is separated from light guiding layer 224 by refractive layer 304. Of course, the light guiding layers may also include nanoparticles of differing sizes as described above.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one ore more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method of creating a solar cell, the method comprising:
   forming a substrate layer;
   growing a plurality of nanowires grown outwardly from the substrate layer, at least two of the nanowires including one or more sub-cells, each sub-cell being formed of a material having a bandgap voltage;
   forming first and second light guiding layers formed of a transparent, light scattering material on top of the substrate layer, the first and second light guiding layers each having the plurality of nanowires passing through them, the first and second light guiding layers configured to scatter light of a particular wavelength, the first light guiding layer directly contacting the substrate and the second light guiding layer being disposed further from the substrate layer than the first light guiding layer;
   forming a first light diffracting layer between a first light guiding layer and the second light guiding layer; and
   forming a second light diffracting layer between the second light guiding layer and a third light guiding layer that is further from the substrate layer than the second light guiding layer.

2. The method of claim 1, wherein the substrate layer is formed of silicon.

3. The method of claim 2, wherein the substrate layer forms a planar solar cell.

4. The method of claim 1, wherein the plurality of sub-cells are formed such that a first sub-cell contacts the substrate layer, a second sub-cell contacts the first sub-cell and a third sub-cell contacts the second sub-cell.

5. The method of claim 1,
   wherein the first light guiding layer includes nanoparticles of a first size, the second light guiding layer includes nanoparticles of a second size and the third light guiding layer includes nanoparticles of a third size.

6. The method of claim 5, wherein the nanoparticles of the first size are larger than the nanoparticles of the second size and the nanoparticles of the second size are larger than the nanoparticles of the third size.

* * * * *